(12) United States Patent  
Rountree

(10) Patent No.: US 8,625,377 B2
(45) Date of Patent: Jan. 7, 2014

(54) LOW VOLTAGE EFUSE PROGRAMMING CIRCUIT AND METHOD

(71) Applicant: Robert N. Rountree, Cotopaxi, CO (US)

(72) Inventor: Robert N. Rountree, Cotopaxi, CO (US)

(*) Notice: Subject to any disclaimer, the term of this patent is extended or adjusted under 35 U.S.C. 154(b) by 0 days.

(21) Appl. No.: 13/763,583

(22) Filed: Feb. 8, 2013

(65) Prior Publication Data

US 2013/0201772 A1 Aug. 8, 2013

Related U.S. Application Data

(60) Provisional application No. 61/596,393, filed on Feb. 8, 2012, provisional application No. 61/606,573, filed on Mar. 5, 2012.

(51) Int. Cl.
*G11C 17/18* (2006.01)

(52) U.S. Cl.
USPC .......................... 365/225.7; 365/96; 365/243

(58) Field of Classification Search
USPC ........................................ 365/96, 225.7, 243
See application file for complete search history.

(56) References Cited

U.S. PATENT DOCUMENTS

| | | | | |
|---|---|---|---|---|
| 4,331,698 A | * | 5/1982 | Behensky et al. | 427/588 |
| 4,562,454 A | * | 12/1985 | Schultz et al. | 257/529 |
| 4,605,872 A | | 8/1986 | Rung | |
| 5,436,496 A | * | 7/1995 | Jerome et al. | 257/529 |
| 5,712,588 A | * | 1/1998 | Choi et al. | 327/525 |
| 5,859,562 A | * | 1/1999 | McCollum | 327/525 |
| 6,438,059 B2 | * | 8/2002 | Akita et al. | 365/225.7 |
| 2002/0109950 A1 | * | 8/2002 | Marr | 361/56 |

* cited by examiner

*Primary Examiner* — Son Dinh
*Assistant Examiner* — Uyen B Tran

(57) ABSTRACT

A circuit for programming a fuse is disclosed. The circuit includes a voltage supply terminal (Vf) and a semiconductor controlled rectifier (222, 224). The fuse is coupled between the voltage supply terminal and the semiconductor controlled rectifier. A switching circuit (200, 202, 208, 210) is coupled to the semiconductor controlled rectifier.

20 Claims, 5 Drawing Sheets

LOW VOLTAGE EFUSE PROGRAMMING CIRCUIT AND METHOD

This application claims the benefit under 35 U.S.C. §119 (e) of Provisional Appl. No. 61/596,393, filed Feb. 8, 2012, and of Provisional Appl. No. 61/606,573, filed Mar. 5, 2012, both of which are incorporated herein by reference in their entirety

BACKGROUND OF THE INVENTION

Embodiments of the present embodiments relate to electronic fuse (efuse) programming under low voltage power supply and process limitations for an integrated circuit in either wafer or packaged form.

Referring to FIG. 1A, there is a current-voltage diagram of a semiconductor controlled rectifier (SCR) of the prior art. FIG. 1B is a simplified diagram of the SCR showing the PNPN impurity layers and intervening junctions J1-J3. Here and in the following discussion it should be understood that a semiconductor controlled rectifier may also be called a silicon controlled rectifier or a thyristor as described by S. M. Sze, "Semiconductor Devices Physics and Technology" 148-156 (John Wiley & Sons 1985). In general, a silicon controlled rectifier is a special case of a semiconductor controlled rectifier that is specifically formed on a silicon substrate. The current-voltage diagram shows a reverse blocking region 100 where junctions J1 and J3 are reverse biased, but junction J2 is forward biased. By way of contrast, junctions J1 and J3 are forward biased, but junction J2 is reverse biased in the forward blocking region 102. At switching voltage Vsw 104, the SCR switches from the forward blocking region to a holding voltage (Vh) and holding current (Ih) region 106. In this mode all three junctions J1-J3 are forward biased and the minimum holding voltage across the SCR may be as low as a single diode drop or approximately 0.7 V. In holding region 106, therefore, the SCR functions as a near ideal switch with very little power dissipation due to the low holding voltage and holding current.

BRIEF SUMMARY OF THE INVENTION

In a preferred embodiment of the present invention, a circuit for programming a fuse is disclosed. The circuit includes a voltage supply terminal and a semiconductor controlled rectifier (SCR). The fuse is coupled between the voltage supply terminal and the semiconductor controlled rectifier. A switching circuit is coupled to the semiconductor controlled rectifier to activate the semiconductor controlled rectifier, thereby programming the fuse.

DETAILED DESCRIPTION OF THE INVENTION

The preferred embodiments of the present invention provide significant advantages of programming electronic fuses in integrated circuits operating at low supply voltages as will become evident from the following detailed description.

Figure 2A:
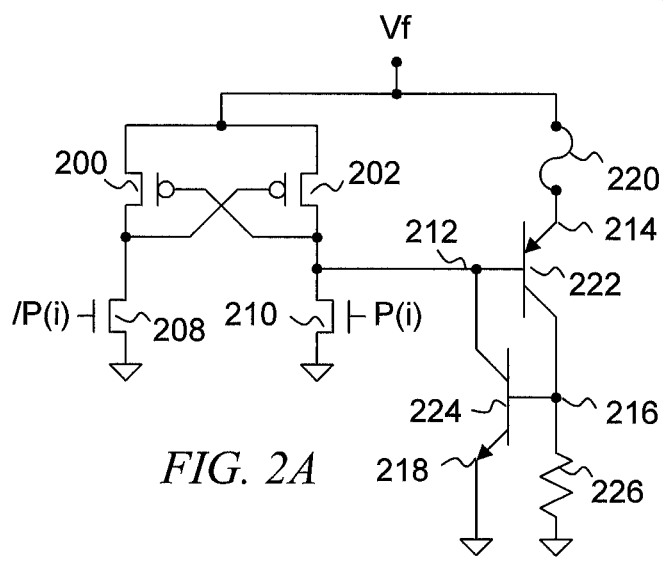
FIG. 2A is a fuse programming circuit of the present invention.

Referring to FIG. 2A, there is a fuse programming circuit of the present invention. The circuit includes a fuse 220, an SCR 222, 224, and a switching circuit 200-210. The switching circuit includes n-channel input transistors 208 and 210 as well as cross-coupled p-channel transistors 200 and 202. The fuse may be constructed of various materials that are well known in the art. In operation, a power supply voltage Vf is applied to fuse 220 and to the switching circuit. Prior to programming, fuse 220 has a low resistance value of preferably less than 100Ω. In this state, complementary programming signals /P(i) and P(i) are high and low, respectively, and the (i) subscript signifies decoded programming signals for the ith fuse. Thus, n-channel transistor 208 and p-channel transistor 202 are both on. Correspondingly, n-channel transistor 210 and p-channel transistor 200 are both off. The voltage on output lead 212, therefore, is approximately equal to power supply voltage Vf and to the voltage at emitter terminal 214 of PNP transistor 222. Thus, the voltage across the base-emitter junction of PNP transistor 222 is approximately zero and PNP transistor 222 remains off. In the off state, there is no collector current from PNP transistor 222, so the base terminal 216 of NPN transistor 224 is held to ground or Vss by parasitic resistor 226. Emitter terminal 218 of NPN transistor 224 is also biased to ground or Vss, so the base-emitter junction of NPN transistor 224 is approximately zero and NPN transistor 224 is also off.

Figure 1A:
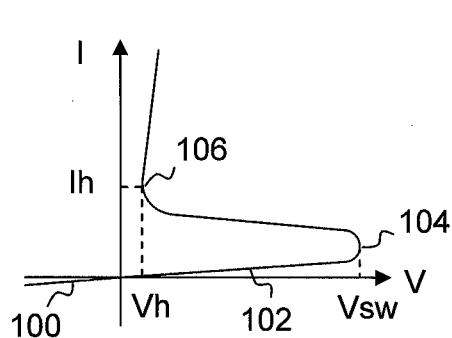
FIG. 1A is a current-voltage diagram of a semiconductor controlled rectifier of the prior art.

In order to program fuse 220, complementary programming signals /P(i) and P(i) are switched to low and high, respectively. Thus, n-channel transistor 208 and p-channel transistor 202 are both off. Correspondingly, n-channel transistor 210 and p-channel transistor 200 are both on. The voltage on output lead 212, therefore, goes low to forward bias the base-emitter junction of PNP transistor 222. Thus, PNP transistor 222 produces collector current which is divided between the base of NPN transistor 224 and parasitic resistor 226. When the collector current is sufficient to forward bias the base-emitter junction of NPN transistor 224, the SCR switches to holding mode 106 (FIG. 1A). In the holding mode a voltage of approximately Vf −0.7 V appears across fuse 220. When power density is sufficient, fuse 220 is blown. Typical programming current for a fuse such as platinum silicide, polycrystalline silicon, or other suitable material may be 10-15 mA. Once the fuse is subjected to a sufficient programming pulse duration, complementary programming signals /P(i) and P(i) are switched back to high and low, respectively. This transition turns on p-channel transistor 202 and returns lead 212 to programming voltage Vf. A fuse read line (not shown) connected to emitter 214 is then compared to a reference voltage to assure that fuse 220 is blown. If the fuse resistance is not sufficiently high, the foregoing process is repeated.

Figure 2B:
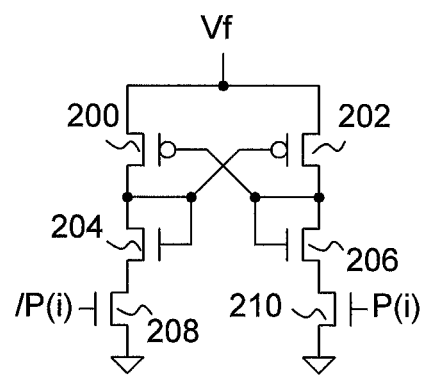
FIG. 2B is an alternative embodiment of a switching circuit that may be used with the fuse programming circuits of FIG. 2A or 5.

There are several advantages to programming fuse 220 with an SCR. First, the SCR maintains a very low on resistance in a holding mode so that most of the power dissipation is in the fuse rather than in the programming circuitry. Second, programming current for the SCR passes through PNP transistor 222 and NPN transistor 224. There are no thin oxide transistors in the programming current path that might be damaged by programming current or voltage. Third, due to the highly conductive state of the SCR in a holding mode, even a 1 µm wide SCR may easily sink 30 mA of programming current with little power dissipation. Fourth, unselected fuse programming circuits connected to the same Vf supply voltage have approximately 0 V across their respective PNP base-emitter junctions without regard to their fuse state. There is no appreciable gate oxide stress in the switching circuits of unselected programming circuits. Fourth, substantially all fuse programming current passes through the SCR rather than the switching circuit. Thus, p-channel and n-channel switching circuit transistors may be near minimum size. Finally, for advanced technologies where programming supply voltage Vf may be too great for p-channel of n-channel gate oxide, a voltage divider circuit such as in FIG. 2B may be used. The switching circuit of FIG. 2B is the same as the switching circuit of FIG. 2A except that n-channel transistors 204 and 206 are configured as diodes and placed in series with re-channel transistors 208 and 210, respectively. In this case, the maximum voltage across any gate oxide is reduced by an n-channel threshold voltage.

Figure 3:
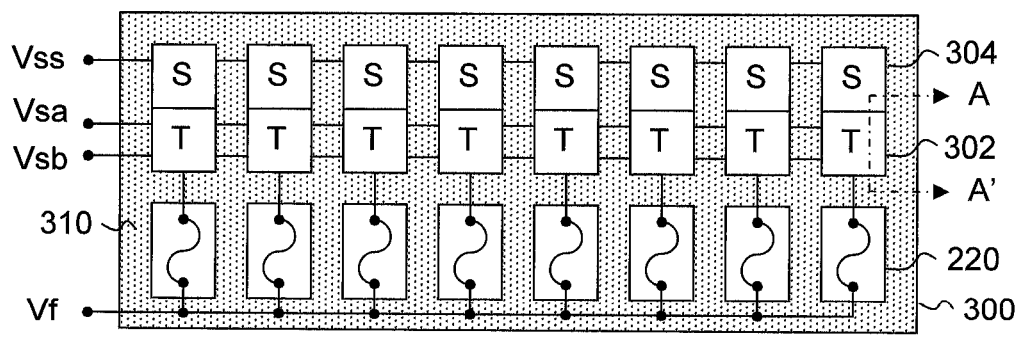
FIG. 3 is an array of fuses and programming circuits of the present invention.

Turning now to FIG. 3, there is an exemplary array of 8 fuse programming circuits 300 as in FIG. 2A. The dotted infill region 310 is an isolation region such as shallow trench isolation (STI). Each fuse programming circuit includes a fuse 220, and SCR 302, and a switching circuit 304 as previously discussed. Power supply leads Vf, Vsa, Vsb, and Vss run horizontally through the array. Decoded programming signals such as /P(i) and P(i) and fuse read lines run vertically through the array. The Vss lead is connected to the sources of n-channel transistors 208 and 210 of each fuse circuit. Ground leads Vsa and Vsb are preferably connected to alternate programming circuits to provide additional isolation. For example, if an emitter of one of NPN transistors 224 is connected to ground lead Vsa, then emitters of adjacent NPN transistors 224 are connected to ground lead Vsb. Thus, any noise imparted to ground lead Vsa during programming is less likely to disturb adjacent fuse programming circuits.

Figure 4:
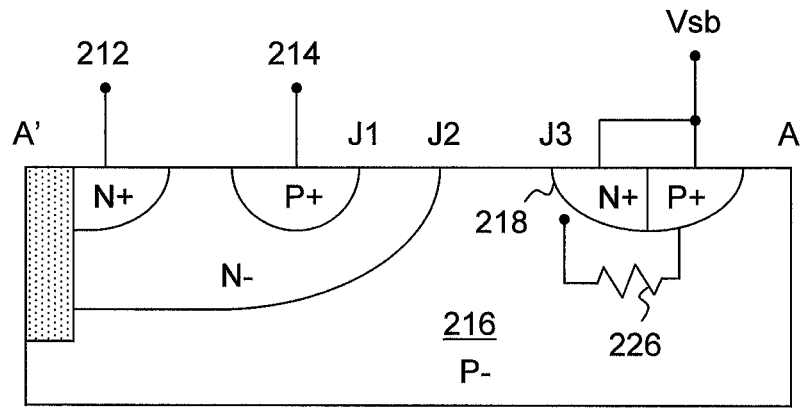
FIG. 4 is a cross sectional diagram of the semiconductor controlled rectifier of FIG. 2A.

Referring now to FIG. 4, there is a cross sectional view of SCR 302 (FIG. 3) along line A-A'. Here, the width of the SCR is in a direction into the page. The plus sign (+) in the following discussion indicates a heavily doped semiconductor region having a concentration of at least 1e18 Atoms/cm^3. Alternatively, the minus sign (−) indicates a lightly doped semiconductor region having a concentration of less than 1e18 Atoms/cm^3. The N+ region connected to terminal 212 provides a bias to the N− well region to selectively activate or trigger the SCR. The P+ region connected to terminal 214 is the emitter of PNP transistor 222 as well as the anode of SCR 302. The P+ region is formed in an N− well that is the base of PNP transistor 222. The N− well is both the collector of NPN transistor 224 as well as the base of PNP transistor 222. The P− substrate 216 is both the collector of PNP transistor 222 as well as the base of NPN transistor 224. N+ region 218 is the emitter of NPN transistor 224. Both the N+ region 218 and adjacent P+ region are coupled to receive reference supply voltage Vsb. Parasitic resistor 226 forms a shunt between supply voltage terminal Vsb and the effective base region of NPN transistor 224 and affects the holding voltage of SCR 302. For example, a small value of resistor 226 produces a high holding voltage Vh. Likewise, a greater value of resistor 226 produces a relatively lower holding voltage Vh.

Figure 5:
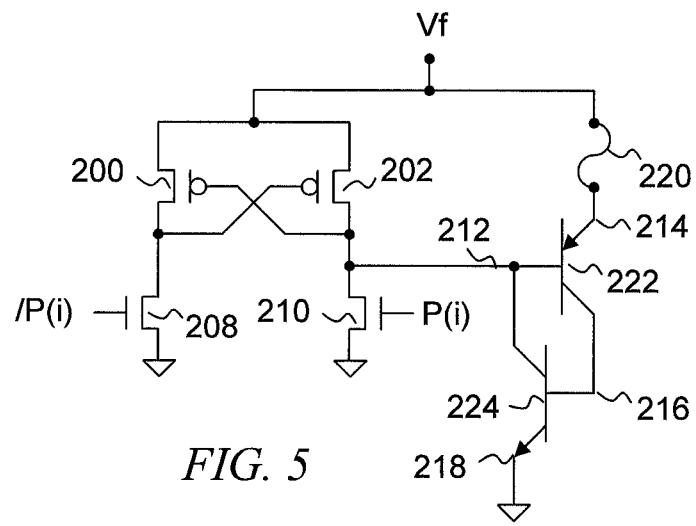
FIG. 5 is another fuse programming circuit of the present invention.
Figure 6:
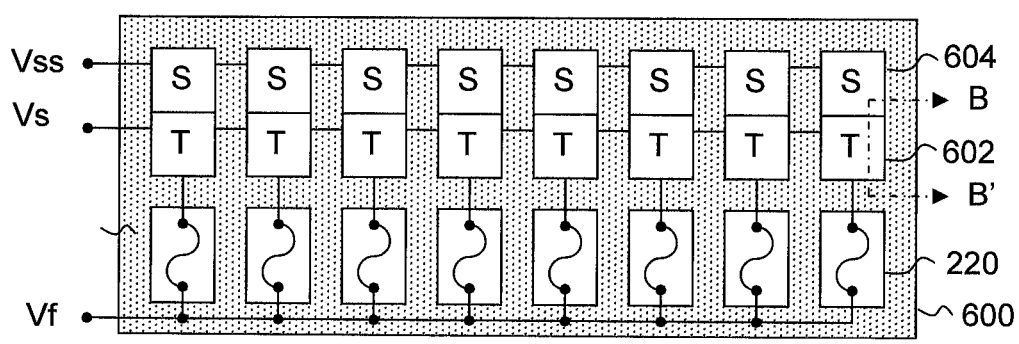
FIG. 6 is another array of fuses and programming circuits of the present invention.

Referring to FIG. 5, there is another embodiment of a fuse programming circuit of the present invention. This embodiment is similar to the previously discussed embodiment of FIG. 2A except that parasitic resistor 226 may be excluded in a triple well process. The triple well process provides an advantage in isolating adjacent programming circuits 602 and 604. As shown in fuse array 600 at FIG. 6, there is no need to include separate reference supply terminals. Thus, reference supply terminals Vsa and Vsb (FIG. 3) are replaced with a single reference supply terminal Vs, which is connected to the cathode of SCR 602 or the emitter of NPN transistor 224.

Figure 7:
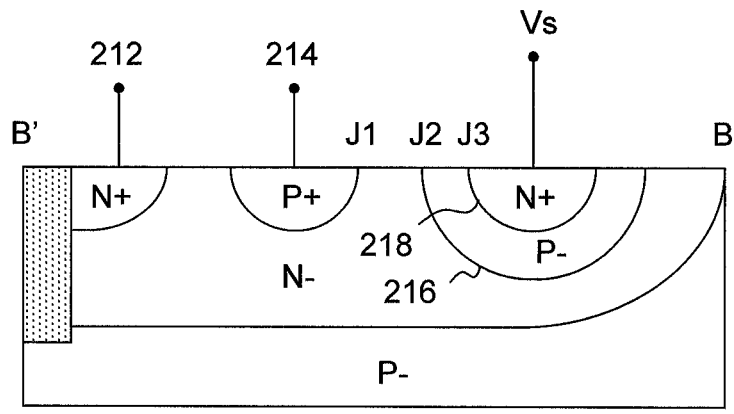
FIG. 7 is a cross sectional diagram of the semiconductor controlled rectifier of FIG. 5.

Turning now to FIG. 7, there is a cross sectional view of SCR 602 (FIG. 5) along line B-B'. This is similar to the previously discussed SCR of FIG. 4, except that the N− region is extended to completely enclose P− region 216 below the semiconductor surface. In this arrangement, the base of NPN transistor 224 is said to be floating or junction isolated. However, NPN transistor remains off, since there is no base current until PNP transistor 222 produces collector current as previously discussed. The absence of parasitic resistor 226 advantageously reduces the holding voltage Vh and the on resistance of SCR 602. Thus, more power dissipation during fuse programming occurs in the fuse itself rather than in the SCR 602 or in the switching circuit 604.

Figure 8:
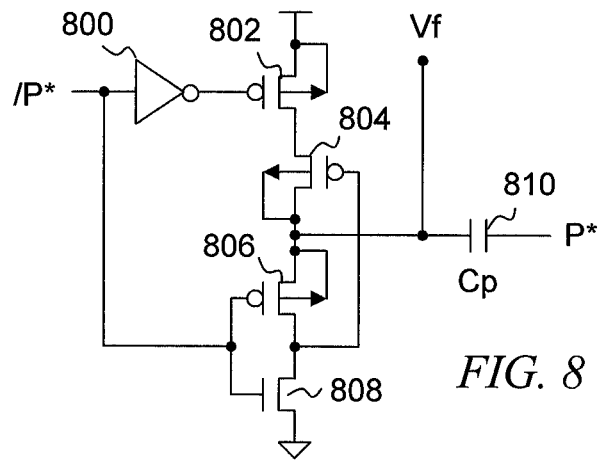
FIG. 8 is a boost circuit that may be used to produce a fuse programming voltage for the fuse arrays of FIGS. 3 and 6.

Referring to FIG. 8, there is a boost circuit that may be used to generate power supply voltage Vf. This circuit provides a significant advantage in fuse programming when an external terminal for Vf is not available. This condition may occur in a packaged integrated circuit where an external terminal would require an additional package connector. Moreover, integrated circuit internal regulated voltage supplies may have insufficient voltage or current to program a fuse. The boost circuit includes p-channel transistor 802 having a source and bulk terminal connected to power supply terminal Vdd. P-channel transistor 804 has a source connected to the drain of p-channel transistor 802. The drain and bulk terminal of p-channel transistor 804 are connected to fuse power supply terminal Vf. P-channel transistor 806 and n-channel transistor 808 form an inverter having an output terminal connected to the gate of p-channel transistor 804. The source and bulk terminal of p-channel transistor 806 are connected to the source of p-channel transistor 804 and to fuse power supply terminal Vf. A boost capacitor Cp has one terminal connected to fuse power supply terminal Vf and another terminal coupled to receive control signal P*. Inverter 800 has an output terminal connected to the gate of p-channel transistor 802 and an input terminal coupled to receive complementary control signal /P*, which is also applied to the gates of p-channel transistor 806 and n-channel transistor 808. Control signal P* and complementary control signal /P* are global programming signals that operate in synchronization with programming signals P(i) and /P(i). In other words, when any of programming signals P(i) and /P(i) change state, global programming signals P* and /P* also change state.

Figure 9:
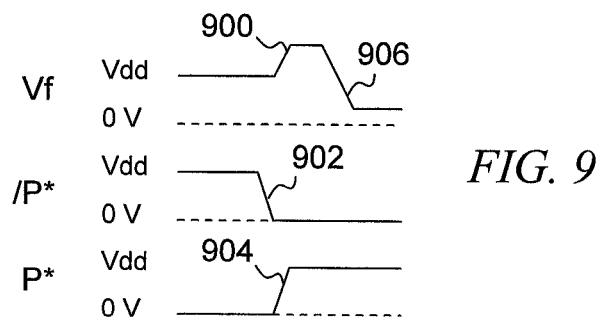
FIG. 9 is a timing diagram showing operation of the boost circuit of FIG. 8.

Referring to FIG. 9, operation of the boost circuit of FIG. 8 will be explained in detail. Global programming signals P* and /P* are initially low and high, respectively. The high level of /P* produces a low output from inverter 800 to turn on p-channel transistor 802. Likewise, the high level of /P* produces a low output from the inverter formed by p-channel transistor 806 and n-channel transistor 808 to turn on p-channel transistor 804. P-channel transistor 806 and n-channel transistor 808 remain off and on, respectively. In this state, fuse power supply voltage terminal Vf and capacitor Cp 810 are precharged to power supply voltage Vdd. When a fuse is to be programmed, /P* goes low 902. The low level of /P* produces a high level output from inverter 800 to turn off p-channel transistor 802. The low level of /P* also produces a high level output from the inverter formed by p-channel transistor 806 and n-channel transistor 808 to turn off p-channel transistor 804. In this state, p-channel transistor 806 and n-channel transistor 808 remain on and off, respectively, and the precharge level is maintained at fuse power supply terminal Vf and across boost capacitor Cp 810. P* then goes high 904 to boost fuse power supply voltage Vf to a desired level 900 for programming a selected fuse. The boosted voltage level 900 depends on the ratio of sizes of capacitor Cp and the parasitic capacitance of fuse voltage supply terminal Vf. For example, if the ratio of Cp to parasitic capacitance of fuse power supply terminal Vf is 4, the boosted voltage level is 1.8 Vdd. As previously discussed, the bulk terminals of p-channel transistors 804 and 806 are both connected to fuse power supply terminal Vf to prevent forward bias of their corresponding parasitic PNP transistors. After fuse power supply voltage Vf is boosted, programming signals P(i) and /P(i) go high and low, respectively, to activate an SCR corresponding to the fuse to be programmed. The activated SCR discharges capacitor Cp 810 at time 906 through fuse 220 to program the fuse as previously discussed. The boost circuit of FIG. 8 advantageously produces a sufficiently high and controlled voltage to program fuses when an external voltage is not available. Programming voltage and current is determined by the size of capacitor Cp. No thin oxide transistors in the selected or unselected switching circuits receive a voltage across gate oxide that is greater than supply voltage Vdd.

Figure 10A:
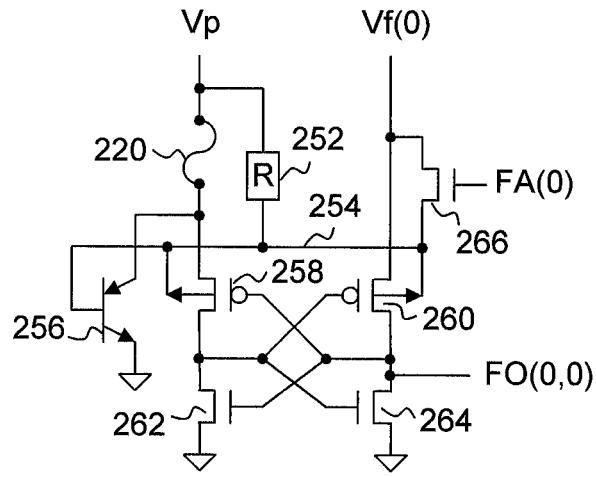
FIG. 10A is a schematic diagram of a fuse programming circuit another embodiment of the present invention.
Figure 10B:
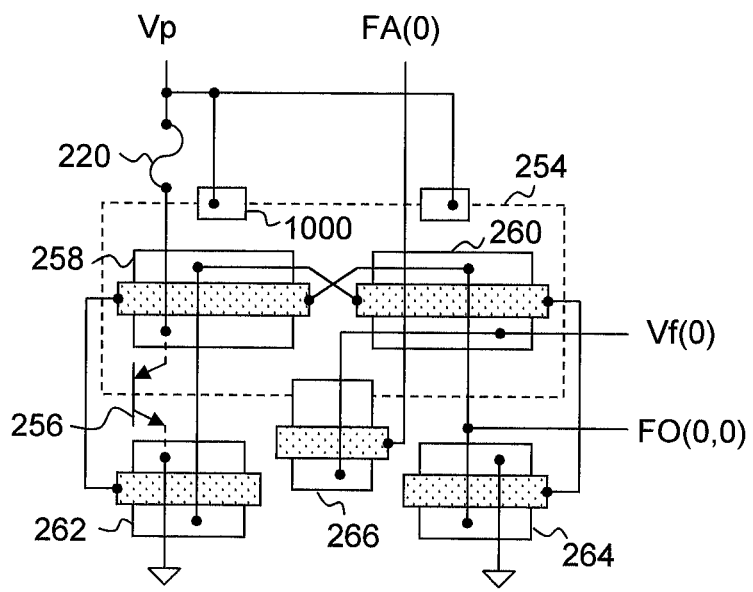
FIG. 10B is a simplified layout diagram of the fuse programming circuit of FIG. 10A.

Referring now to FIG. 10A, there is a one bit fuse programming circuit of another embodiment of the present invention. Although the fuse programming circuit is specifically directed to fuse programming, one of ordinary skill in the art having access to the instant specification will understand the present invention is also applicable to antifuses. The circuit includes fuse 220, SCR 256, fuse latch circuit 258-264, and a trigger transistor 266. Fuse latch circuit 258-264 includes p-channel transistors 258-260 and n-channel transistors 262-264. FIG. 10B is a simplified layout of the circuit of FIG. 10A. Control gates of the transistors are indicated by dotted infill. Here and in the following discussion the same reference numerals are used to indicate the same elements.

Prior to programming, fuse 220 is electrically conductive having a resistance of preferably less than 100 ohms. In this state, fuse voltage Vf(0) goes high during power up after programming voltage Vp is high. Fuse address signal FA(0) is low so that n-channel transistor 266 is off. Parasitic resistor 252 holds the bulk terminal of p-channel transistors 258-260 at programming voltage Vp. The fuse latch 258-264 is set so that p-channel transistor 260 and n-channel transistor 262 are both off. Correspondingly, p-channel transistor 258 and n-channel transistor 264 are both on. Thus, fuse output signal FO(0,0) is low, indicating fuse 220 has not been programmed.

Figure 1B:
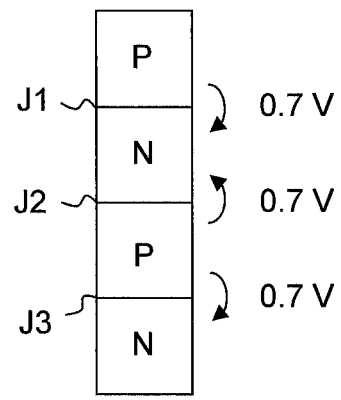
FIG. 1B is a simplified diagram of a semiconductor controlled rectifier of the prior art.

Referring now to FIG. 10B, the structure of SCR 256 will be explained in detail. SCR 256 is incorporated in the design of fuse latch circuit 258-264 so that no additional layout area is required. SCR 256 includes both PNP and NPN bipolar transistors as shown at FIG. 1B. The P+ source of p-channel transistor 258 is the anode of SCR 256 and together with n-well 254 and P− substrate they form the emitter, base, and collector, respectively, of the PNP bipolar transistor. The n-well 254, P− substrate, and source of re-channel transistor 262 form the collector, base, and emitter, respectively, of the NPN bipolar transistor. There are several features of the circuit of FIGS. 10A-10B that provide significant advantages over fuse programming circuits of the prior art. First, the SCR 256 is incorporated in the fuse latch circuit 258-264 so that no additional layout area is required. Second, the sources of p-channel transistor 258 and n-channel transistor 262 are closely spaced without other intervening heavily doped semiconductor regions to provide a minimum holding voltage when SCR 256 is latched. This is important for low voltage operation. Third, the width direction of p-channel transistor 258 and n-channel transistor 262 are parallel and closely spaced to provide maximum width with minimum power dissipation and heat generation in a latched state. Fourth, the transistors of the fuse latch circuit are shown with a width-to-length (W/L) ratio of greater than one so than intervening buffer stages for fuse output signal FO(0,0) may not be required. However, with a width of less than 1 μm, SCR 256 will sink a current of 30 mA for typical complementary metal oxide semiconductor (CMOS) processes. Fifth, n-well contacts such as n-well contact 1000 are advantageously positioned adjacent the drain side of p-channel transistors 258-260 and opposite their sources. This increases the n-well resistance of parasitic resistor 252 by increasing the distance to the N+/P− junction J2 as well as reducing the n-well cross-sectional area for conduction due to the depletion width of P+/N− depletion region. Finally, the increased value of resistor 252 decreases the shunt resistance across the base-emitter junction of the PNP bipolar transistor and reduces trigger current required by n-channel trigger transistor 266. Thus, only a minimum size n-channel trigger transistor 266 is necessary and the holding voltage of SCR 256 is further reduced.

Figure 11:
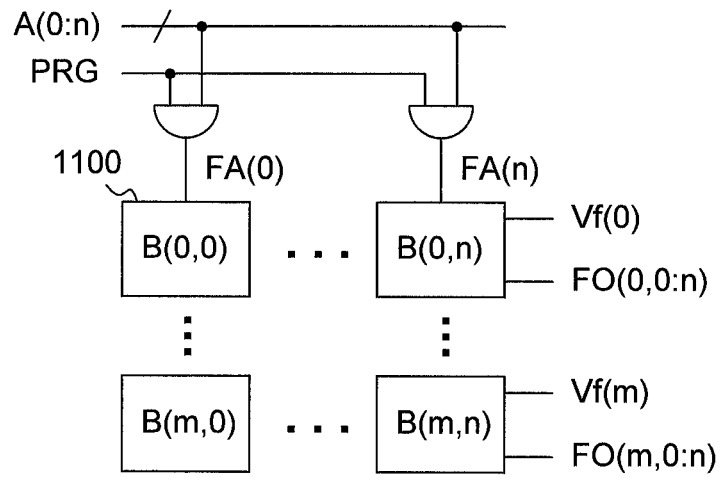
FIG. 11 is a schematic diagram of an array of fuse programming circuits as in FIGS. 10A-10B.

Referring now to FIG. 11, there is a schematic diagram of an array of fuse programming circuits as in FIGS. 10A-10B. Each fuse programming circuit, such as fuse programming circuit 1100, is the same as described at FIGS. 10A-10B. The array of fuses is organized in rows and columns. In the example of FIG. 11, there are m+1 rows and n+1 columns, where m and n are both positive integers. Each row of fuse programming circuits may correspond to a redundant row decoder, a redundant column decoder, or other desired circuit operations to be modified by fuse programming. Each row of fuse programming circuits produces n+1 fuse output signals. For example, the first row produces fuse output signals FO(0, 0:n).

Figure 12:
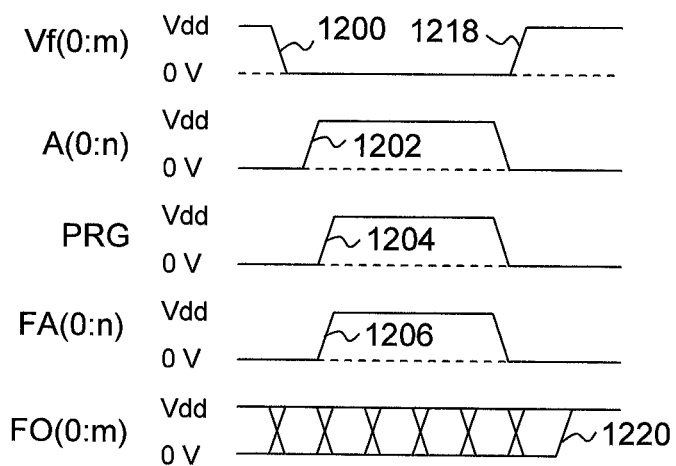
FIG. 12 is a timing diagram showing operation of the array of fuse programming circuits of FIG. 11.

The timing diagram of FIG. 12 will be used to explain operation of the array of fuse programming circuits of FIG. 11. Initially the programming voltage Vp and the fuse voltage Vf(0:m) are both at power supply voltage Vdd. By way of example, the following explanation will apply specifically to fuse programming circuit 1100, although the entire row B(0, 0) through B(0,n) might be programmed at one time. At time 1200, fuse voltage Vf(0:m) goes low. This grounds the source of p-channel transistor 260 and the source of n-channel transistor 266 (FIG. 10A). At time 1202, a program address is applied to address bus A(0:n). If the fuse 220 of fuse programming circuit 1100 is to be programmed, address A(0:0) will be high. The address for any fuse programming circuit in row 0 that is not to be programmed will remain low. At time 1204, programming signal PRG goes high and applies a high level fuse address FA(0:0) to fuse programming circuit 1100. The high level of FA(0:0) turns on n-channel trigger transistor 266 and pulls n-well 254 low to provide base current to the PNP transistor of SCR 256. Responsively, SCR 256 latches and drives the anode of SCR 256 to holding voltage 106 (FIG. 1A). Programming voltage Vp is at a high level of power supply voltage Vdd, so SCR 256 latches to conduct sufficient current to blow fuse 220. After fuse 220 is blown, address A(0:0) and programming signal PRG go low. Responsively, fuse address FA(0:0) goes low and turns off n-channel trigger transistor 256. At time 1218, fuse voltage Vf(0:0) returns high to set the fuse latch 258-264. This produces a valid high fuse output signal FO(0:0) at time 1220.

There are several advantages to this programming method. First, it is possible to program single or multiple fuse programming circuits on row 0 by selectively applying a high level signal on address bus A(0:n). This is easily accomplished in a design-for-test (DFT) mode as is well known to those of ordinary skill in the art. Second, each row 0-m may be individually programmed as necessary without affecting previously programmed rows. Moreover, multiple fuse arrays as in FIG. 11 may be separately programmed without affecting previously programmed fuse arrays. Third, although programming voltage Vp is always high, the off state of p-channel transistor 258 when latched prevents current flow through a partially blown or high resistance fuse 220 during normal circuit operation. The fuse latch circuit 258-264, therefore, is correctly set for a wide range of programmed resistance values of fuse 220. Fourth, all transistors of the fuse programming circuit of FIG. 10B may be near minimum design size. Thus, required layout is greatly reduced over methods of the prior art. Additionally, SCR 256 is integrated into fuse latch 258-264 to further reduce required layout area. It is desirable, however, to assure that current density through the metal-to-silicon contacts of SCR 256 remains below 1e7 A/cm^2. Finally, the low holding voltage of SCR 256 greatly reduces power dissipation and heat generation during programming as compared to other methods of the prior art. Thus, reliability is greatly improved.

Still further, while numerous examples have thus been provided, one skilled in the art should recognize that various modifications, substitutions, or alterations may be made to the described embodiments while still falling with the inventive scope as defined by the following claims. Other combinations will be readily apparent to one of ordinary skill in the art having access to the instant specification.

What is claimed is:

1. A circuit, comprising:
a voltage supply terminal;
a switching circuit having a p-channel transistor having a first source terminal and an n-channel transistor having a second source terminal;
a semiconductor controlled rectifier having an anode comprising the first source terminal and a cathode comprising the second a source terminal, wherein the anode and cathode are spaced apart without intervening heavily doped regions; and
a fuse coupled between the voltage supply terminal and the semiconductor controlled rectifier.

2. A circuit as in claim 1, wherein the switching circuit comprises a level translator.

3. A circuit as in claim 1, wherein the switching circuit is coupled to receive a control signal and arranged to trigger the semiconductor controlled rectifier in response to a first logic state of the control signal.

4. A circuit as in claim 1, comprising a plurality of fuse circuits arranged in rows and columns, each fuse circuit comprising:

a switching circuit having a p-channel transistor having a first source terminal and an n- channel transistor having a second source terminal;
a semiconductor controlled rectifier having an anode comprising the first source terminal and a cathode comprising the second a source terminal, wherein the anode and cathode are spaced apart without intervening heavily doped regions; and
a fuse coupled between the voltage supply terminal and the semiconductor controlled rectifier.

5. A circuit as in claim 4, wherein each fuse circuit is individually addressable.

6. A circuit as in claim 4, wherein at least two of the fuse circuits may be programmed at a same time.

7. A circuit as in claim 1, wherein the semiconductor controlled rectifier comprises an NPN transistor having a base-emitter junction, and wherein the base is floating.

8. A circuit as in claim 1, wherein the voltage supply terminal is formed on an integrated circuit, and wherein the voltage supply terminal is arranged to receive a supply voltage external to the integrated circuit.

9. A circuit as in claim 1, wherein the voltage supply terminal is formed on an integrated circuit, and wherein the voltage supply terminal is arranged to receive boosted supply voltage produced by the integrated circuit.

10. A circuit as in claim 1, wherein the switching circuit comprises a latch circuit.

11. A circuit, comprising:
a voltage supply terminal;
a p-channel transistor having a first drain terminal and a first source terminal;
an n-channel transistor having a second drain terminal connected to the first drain terminal and having a second source terminal;
a semiconductor controlled rectifier having an anode comprising the first source terminal and a cathode comprising the second a source terminal; and
a fuse coupled between the voltage supply terminal and the semiconductor controlled rectifier.

12. A circuit as in claim 11, comprising a level translator.

13. A circuit as in claim 11, comprising a latch circuit including the p-channel transistor and the n-channel transistor.

14. A circuit as in claim 11, wherein the fuse is an antifuse.

15. A circuit as in claim 11, wherein the semiconductor controlled rectifier comprises an NPN transistor having a base-emitter junction, and wherein the base is floating.

16. A circuit as in claim 11, wherein the voltage supply terminal is formed on an integrated circuit, and wherein the voltage supply terminal is arranged to receive boosted supply voltage produced by the integrated circuit.

17. A circuit, comprising a plurality of fuse circuits arranged in rows and columns and coupled to a voltage supply terminal, each fuse circuit comprising:
a p-channel transistor having a first drain terminal and a first source terminal;
an n-channel transistor having a second drain terminal connected to the first drain terminal and having a second source terminal;
a semiconductor controlled rectifier having an anode comprising the first source terminal and a cathode comprising the second a source terminal; and
a fuse coupled between the voltage supply terminal and the semiconductor controlled rectifier.

18. A circuit as in claim 17, wherein each fuse circuit is individually addressable.

19. A circuit as in claim 17, wherein at least two of the fuse circuits may be programmed at a same time.

20. A circuit as in claim 17, wherein the anode and cathode of each semiconductor controlled rectifier are spaced apart without intervening heavily doped regions.

\* \* \* \* \*